US005784015A

United States Patent [19]
Frindle

[11] Patent Number: 5,784,015
[45] Date of Patent: Jul. 21, 1998

[54] SIGNAL PROCESSING APPARATUS AND METHOD WITH A CLOCK SIGNAL GENERATOR FOR GENERATING FIRST AND SECOND CLOCK SIGNALS HAVING RESPECTIVE FREQUENCIES HARMONICALLY RELATED TO A SAMPLING FREQUENCY

[75] Inventor: Paul Anthony Frindle, Witney, United Kingdom

[73] Assignees: Sony Corporation, Tokyo, Japan; Sony United Kingdom Limited, Weybridge, England

[21] Appl. No.: 928,076

[22] Filed: Sep. 11, 1997

Related U.S. Application Data

[63] Continuation of Ser. No. 528,039, Sep. 14, 1995, abandoned.

[30] Foreign Application Priority Data

Sep. 29, 1994 [GB] United Kingdom ................... 9419639
Jul. 31, 1995 [GB] United Kingdom ................... 9515644

[51] Int. Cl.$^6$ ................................ H03M 1/06
[52] U.S. Cl. ................................ 341/118; 341/155
[58] Field of Search ................................ 341/118, 122, 341/123, 155

[56] References Cited

U.S. PATENT DOCUMENTS

| | | | |
|---|---|---|---|
| 4,876,542 | 10/1989 | Van Bavel | 341/143 |
| 4,882,773 | 11/1989 | Maloney | 359/182 |
| 4,893,316 | 1/1990 | Janc et al. | 375/271 |
| 4,991,218 | 2/1991 | Kramer | 381/61 |
| 5,241,285 | 8/1993 | Jackson | 331/1 A |
| 5,594,443 | 1/1997 | Lam | 341/144 |
| 5,649,160 | 7/1997 | Corry et al. | 711/167 |

*Primary Examiner*—Jeffrey A. Gaffin
*Assistant Examiner*—Jason L. W. Kost
*Attorney, Agent, or Firm*—Frommer Lawrence & Haug LLP; William S. Frommer

[57] ABSTRACT

Signal processing apparatus comprises at least one digital signal processing device mounted on a circuit board, for performing sample-based signal processing at a sampling frequency; and a switched mode power supply mounted on the circuit board, the switched mode power supply operating at a switching frequency derived from the sampling frequency of the digital signal processing device.

7 Claims, 2 Drawing Sheets

SIGNAL PROCESSING APPARATUS AND METHOD WITH A CLOCK SIGNAL GENERATOR FOR GENERATING FIRST AND SECOND CLOCK SIGNALS HAVING RESPECTIVE FREQUENCIES HARMONICALLY RELATED TO A SAMPLING FREQUENCY

This application is a continuation, of application Ser. No. 08/528,039, filed Sep. 14, 1995.

BACKGROUND OF THE INVENTION

1. Field of the Invention

This invention relates to signal processing apparatus.

2. Description of the Prior Art

An example of a signal processing apparatus is found in an analogue input stage of a digital signal processing system such as a digital audio mixing console. In such an input stage, the mixture of analogue signal processing (which may involve very low-level signals such as microphone signals) with high-speed digital processing to handle the resulting sampled signal (often at 16 to 20 bits resolution with a sampling frequency greater than 40 kHz (kilohertz)) can place very stringent requirements on the electronic design of the input stage, to avoid crosstalk or induced noise between the analogue and digital parts of the circuit.

For example, such an input stage might comprise a high gain (analogue) microphone amplifier, one or more analogue to digital converters (ADCs), a digital filtering device and additional logic units. The microphone amplifier might typically receive supply power from a switched mode power supply.

In previous systems of this type, the ADCs operate at a clock frequency related to the audio sampling frequency, but the other components and power supply operate at fixed (preset) operating frequencies unrelated to the sampling frequency. Noise induced between these different components, largely due to their different operating and sampling frequencies, potentially caused a large amount of unwanted noise in the input stage.

This problem of induced noise has meant that in previous systems, not all of the above components could be mounted on the same circuit board. For example, the particularly sensitive high-gain microphone amplifier is typically powered by an off-board switched mode power supply, to try to reduce the level of noise induced in the amplifier at the switching frequency. This added to the complexity and cost of the whole system, by requiring multiple circuit boards and relatively expensive off-board components to be used.

SUMMARY OF THE INVENTION

This invention provides signal processing apparatus comprising: at least one digital signal processing device mounted on a circuit board, for performing sample-based signal processing at a sampling frequency; and a switched mode power supply mounted on the circuit board, the switched mode power supply operating at a switching frequency derived from the sampling frequency of the digital signal processing device.

The invention addresses the conflicting problems of cost and induced noise by the counter-intuitive step of placing at least the switched mode power supply and a sample-based digital signal processing device (such as, though not necessarily, and ADC) on the same circuit board, but then deriving the operating (switching) frequency of the power supply from the sampling frequency of the digital signal processing device.

This arrangement does not necessarily reduce the noise induced from the switched mode power supply; however, because the switching frequency is derived from (e.g. harmonically related to) the sampling frequency, the induced noise can fall into ranges of low or null response in the sampling process.

Various types of digital signal processing devices are envisaged, although the invention is particularly suitable where the digital signal processing device is an analogue to digital converter operable to sample an analogue input signal at the sampling frequency. Preferably an analogue amplifier is mounted on the circuit board for amplifying the analogue input signal, the analogue amplifier receiving a power from the switched mode power supply.

Preferably a programmable digital filtering device is mounted on the circuit board, the digital filtering device operating at a clock frequency derived from the sampling frequency. This again is a particularly counter-intuitive way of operating such a device, since this type of device is generally set up to run asynchronously with a local crystal oscillator providing a clock frequency which is selected to be high enough to allow the filtering operations to be completed each sample period.

Although the sampling frequency may be preset, and the other operating frequencies derived from it when the apparatus is manufactured, it is also possible that the sampling frequency is user-selectable from at least two possible sampling frequencies, so that dedicated circuitry is provided to derive each required operating frequency from the current sampling frequency.

The invention is particularly suitable for use in digital audio processing apparatus.

This invention also provides a method of operating a circuit board on which at least one digital signal processing device for performing sample-based signal processing at a current one of at least two possible sampling frequencies and a switched mode power supply are mounted; the method comprising the step of varying the switching frequency of the switched mode power supply in dependence upon the current sampling frequency of the digital signal processing device.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 1:
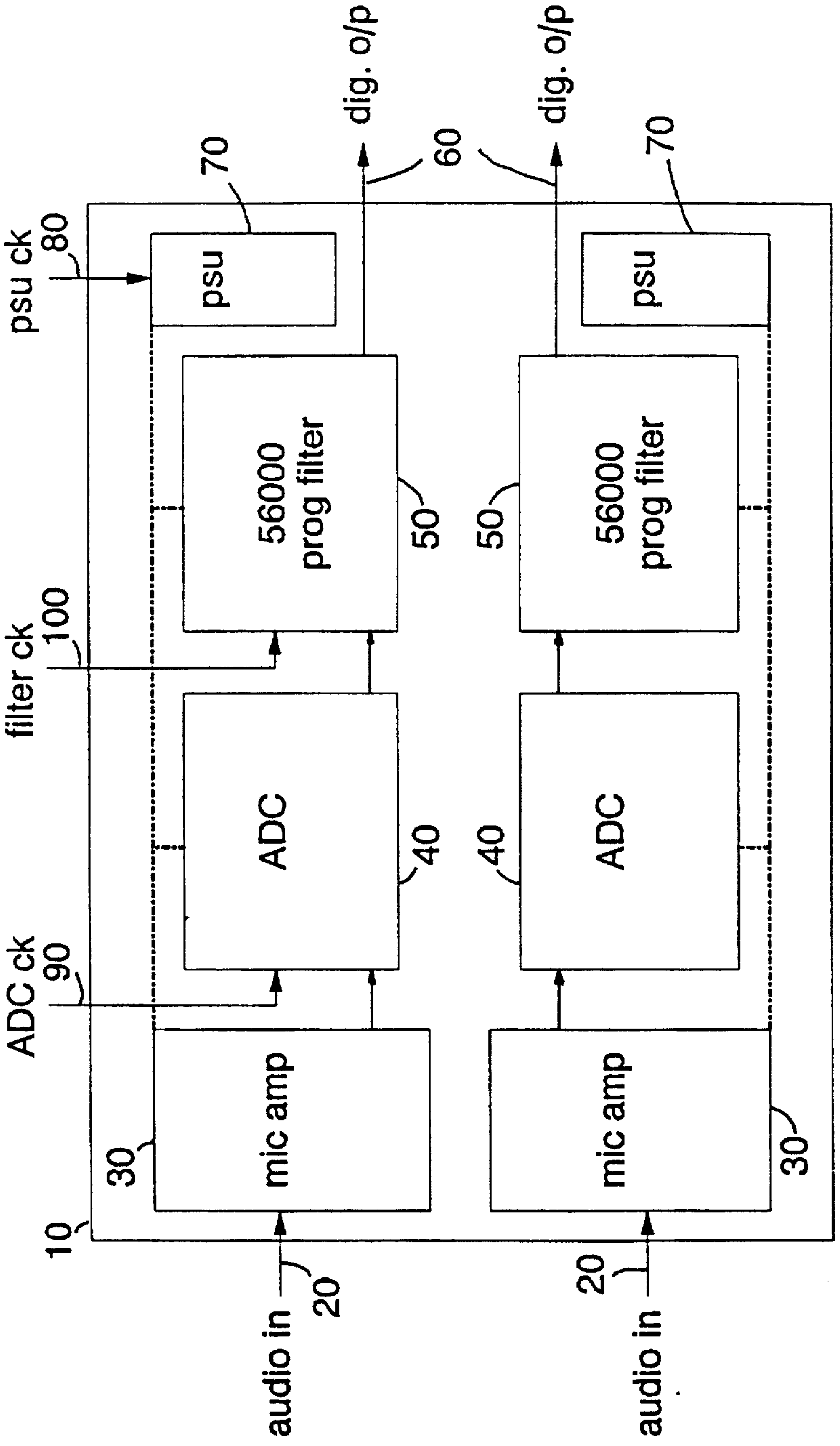
FIG. 1 is a schematic block diagram of a circuit board.

FIG. 1 is a schematic block diagram of a circuit board 10 on which components are mounted forming an analog input stage of a digital audio mixing console (not shown).

Left and right channel audio input signals 20 are first amplified by a respective microphone amplifier 30 and are then digitized by an analog-to-digital converter (ADC) 40. The digitized output of the ADC 40 is supplied to a program digital filter 50 (in this case, a filter device of the Motorola 56000 series) which generates a digital output signal 60 to be supplied to the remainder of the audio mixing console.

In the present embodiment, the ADC 40 is a low resolution but very high sampling rate device, and the digital output 60 is generated by performing decimation filtering on the output of the ADC 40 to provide a higher resolution but lower sampling rate output signal 60. A typical output 60 of the programmable filter 50 is a 20 -bit 48 kHz digital audio signal. This approach to analog-to-digital conversion is described in the book "Digital Signal Processing, Principles Algorithms and Applications", Proakis and Manolakis, 2nd Edition, Macmillan Publishing Company, 1992.

The circuit board 10 forms one of a group of circuit boards providing a number of analog microphone-level inputs for the digital audio mixing console. The respective digital outputs 60 can be transmitted via a backplane to which all of the cards are connected, to further parts of the processing apparatus.

The microphone amplifier 30, the ADC 40 and the programmable filter 50 (and other miscellaneous components (not shown)), receive power from a switched mode power supply 70. The switching frequency of the switch mode power supply is controlled by a psu clock signal 80, to be described below.

Similarly, each analog-to-digital converter 40 operates under the control of an ADC clock signal 90, and each programmable filter device 50 operates under the control of a filter clock signal 100. The derivation of the psu, ADC and filter clock signals will now be described with reference to FIG. 2.

Figure 2:
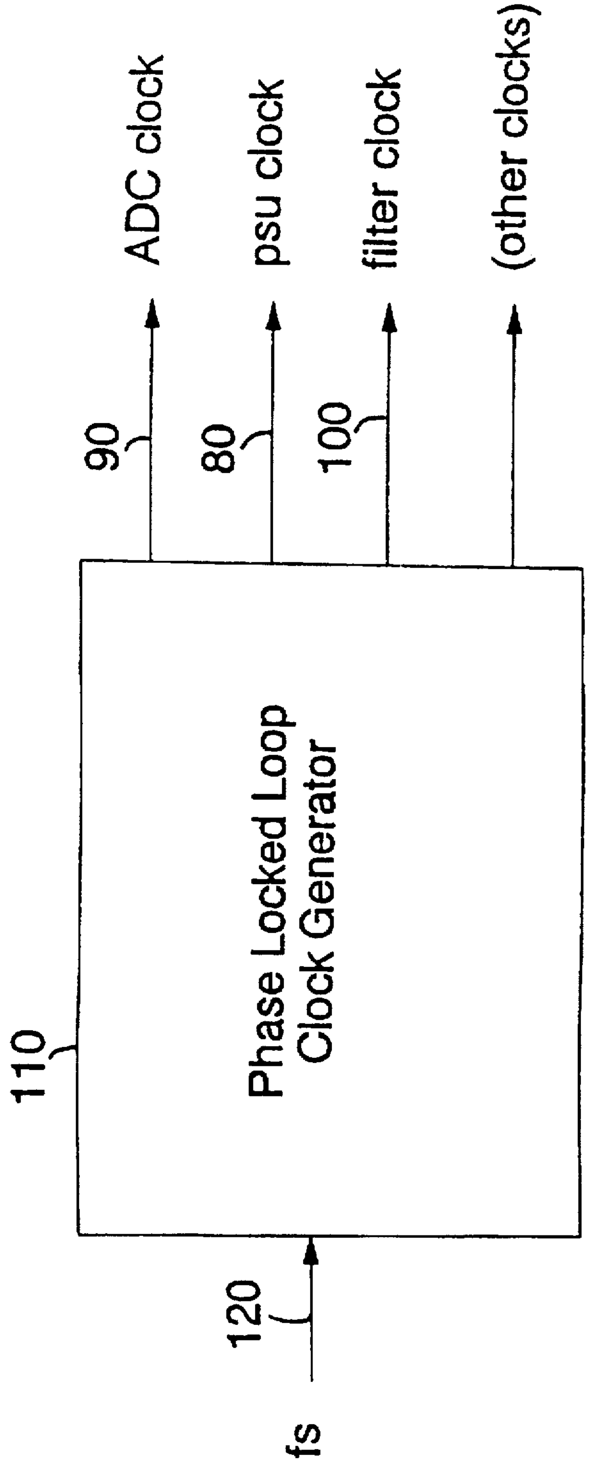
FIG. 2 is a schematic block diagram of a clock signal generator.

FIG. 2 is a schematic block diagram of a clock signal generator. In the present embodiment, a single clock signal generator generates clock signals for a corresponding group of circuit boards; however, a clock signal generator could be provided on each circuit board, or even for each audio channel on each circuit board.

Basically, the clock signal generator is a conventional phase locked loop circuit 110 which receives a signal at the current sampling frequency (fs) 120 (in this case 48 kHz, although fs could be selectable between, say, 44.1 kHz and 48 kHz) and generates multiples and sub-multiples of the sampling frequency fs. For example, the psu clock is set to be double the current sampling frequency, whereas the ADC clock is set to be equal to the current sampling frequency.

This arrangement operates to reduce the effects of clock-induced noise in various parts of the circuit board 10. This is because the sampling process exhibits a very low or null frequency response at the Nyquist frequency (0.5fs) and all multiples of the sampling frequency (fs, 2fs, 4fs . . . ). Accordingly, by selecting each of the clock signals generated by the clock generator 110 to be a multiple of fs, any noise induced into, for example, the high gain microphone amplifier 30, is automatically rejected by the sampling process of the ADC 40.

These measures allow the microphone amplifier 30, the ADC 40, the programmable filter device 50 and the switched mode power supply 70 to be housed on the same circuit board.

Although illustrative embodiments of the invention have been described in detail herein with reference to the accompanying drawings, it is to be understood that the invention is not limited to those precise embodiments, and that various changes and modifications can be effectcd therein by one skilled in the art without departing from the scope and spirit of the invention as defined by the appended claims.

I claim:

1. Apparatus including a circuit board for performing signal processing at a sampling frequency, comprising:

a clock signal generator for generating, as a function of said sampling frequency, at least first and second clock signals having respective frequencies harmonically related to said sampling frequency;

at least one digital signal processing device mounted on said circuit board for performing sample-based signal processing at said sampling frequency, said digital signal processing device operating under control of said first clock signal; and a switched mode power supply mounted on said circuit board for supplying power to said digital signal processing device, said switched mode power supply operating at a switching frequency under control of said second clock signal.

2. Apparatus according to claim 1, in which said digital signal processing device is an analogue to digital converter operable to sample an analogue input signal at said sampling frequency.

3. Apparatus according to claim 1, further comprising an analogue amplifier connected to said analog to digital converter and mounted on said circuit board for amplifying said analogue input signal prior to sampling of said input signal by said analogue to digital converter, said analogue amplifier receiving power from said switched mode power supply.

4. Apparatus according to claim 1, in which said sampling frequency is use-rselectable selectable from at least two possible sampling frequencies.

5. Digital audio processing apparatus comprising apparatus according to claim 1.

6. Apparatus according to claim 1, further comprising a programmable digital filtering device connected to said digital signal processing device and mounted on said circuit board, and wherein said clock signal generator generates a third clock signal having a frequency harmonically related to said sampling frequency, said digital filtering device receiving power from said switched mode power supply and operating under control of said third clock signal.

7. A method of operating a circuit board on which are mounted at least one digital signal processing device for performing sample-based signal processing at a selected one of at least two sampling frequencies and a switched mode power supply for supplying power to said digital signal processing device, said method comprising the steps of:

generating, as a function of the selected sampling frequency, at least first and a second clock signals having respective frequencies harmonically related to the selected sampling frequency;

controlling said digital signal processing device by said first clock signal to perform sample-based signal processing at the selected sampling frequency; and controlling a switching frequency of said switched mode power supply by said second clock signal.

* * * * *